US006858877B2

(12) United States Patent
Kawaguchi et al.

(10) Patent No.: US 6,858,877 B2
(45) Date of Patent: Feb. 22, 2005

(54) NITRIDE SEMICONDUCTOR, METHOD FOR MANUFACTURING THE SAME AND NITRIDE SEMICONDUCTOR DEVICE

(75) Inventors: Yasutoshi Kawaguchi, Kadoma (JP); Akihiko Ishibashi, Sakai (JP); Ayumu Tsujimura, Osaka (JP); Nobuyuki Otsuka, Kawanishi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 36 days.

(21) Appl. No.: 10/352,256

(22) Filed: Jan. 28, 2003

(65) Prior Publication Data

US 2003/0183827 A1 Oct. 2, 2003

Related U.S. Application Data

(63) Continuation of application No. PCT/JP02/05929, filed on Jun. 13, 2002, now abandoned.

(30) Foreign Application Priority Data

Jun. 13, 2001 (JP) ........................................ 2001-178081

(51) Int. Cl.$^7$ ............................................. H01L 33/00
(52) U.S. Cl. ............................. 257/97; 257/94; 257/96
(58) Field of Search .............................. 257/94, 96, 97, 257/200

(56) References Cited

U.S. PATENT DOCUMENTS 6,365,921 B1    4/2002  Watanabe et al.

6,617,607 B2 *  9/2003  Ito et al. ...................... 257/22
2001/0000733 A1  5/2001  Tomioka

FOREIGN PATENT DOCUMENTS

EP          1104031 A2    5/2001
EP          1107296 A2    6/2001

OTHER PUBLICATIONS

Shuji Nakamura,"UV/Blue/Green InGaN–Based LEDs and Laser Diodes Grown on Epitaxially Laterally Overgrown GaN", IEICE Trans. Electron, vol. E83–C, No. 4, Apr. 2000, pp. 529–535.

* cited by examiner

*Primary Examiner*—Carl Whitehead, Jr.
*Assistant Examiner*—Nema Berezny
(74) *Attorney, Agent, or Firm*—McDermott Will & Emery LLP

(57) ABSTRACT

A facet-forming layer made of nitride semiconductor containing at least aluminum is formed on a substrate made of gallium nitride (GaN). A facet surface inclined with respect to a C-surface is formed on the surface of the facet-forming layer, and a selective growth layer laterally grows from the inclined facet surface. As a result, the selective growth layer can substantially lattice-match an n-type cladding layer made of n-type AlGaN and grown on the selective growth layer. For example, a laser structure without cracks being generated can be obtained by crystal growth.

13 Claims, 12 Drawing Sheets

NITRIDE SEMICONDUCTOR, METHOD FOR MANUFACTURING THE SAME AND NITRIDE SEMICONDUCTOR DEVICE

This application is continuation of application PCT/JP02/05929, filed Jun. 13, 2002, now abandoned.

BACKGROUND OF THE INVENTION

The present invention relates to a nitride semiconductor and a method for manufacturing the same, and in particular, to a nitride semiconductor device that is formed by the manufacturing method and expected to be applied to a field of optical information processing.

A nitride semiconductor containing nitrogen (N) as an element of the group V is considered to be hopeful as materials for short wavelength luminous element because its band gap is relatively large. Among the nitride semiconductors, a gallium nitride-based compound semiconductor that is represented by general formula $Al_xGa_yIn_zN$ (wherein $0 \leq x$, y, $z \leq 1$, $x+y+z=1$) has been studied hard. Blue light emitting diode (LED) device and green light emitting diode device have already been in practical use.

A short wavelength semiconductor laser device with about 400 nm of oscillation wavelength has been desired eagerly in order to extend a capacity of optical disk unit. A nitride semiconductor laser device using a gallium nitride-based compound semiconductor has attracted attention and has been reaching the level of practical use.

A nitride semiconductor laser device is formed by crystal growth on a substrate made of gallium nitride (GaN). Nevertheless, it is difficult to produce a substrate (wafer) made of silicon (Si) or gallium arsenide (GaAs). For this reason, for example, as reported in IEICE TRANS. ELECTRON, VOL. E83-C, No. 4, PP.529–535(2000), on a substrate made of sapphire, a semiconductor laser made of gallium arsenide (GaN) is grown to a thickness of 100 μm or larger by eptaxial lateral overgrowth technique utilizing hydride vapor phase epitaxy (HVPE) or metal organic vapor phase epitaxy (MOVPE). Then, the sapphire substrate is removed and thus a substrate made of gallium nitride is produced.

FIG. 12 shows a cross-sectional structure of a conventional gallium nitride-based semiconductor laser device that laser oscillation has been accomplished.

As shown in FIG. 12, on a substrate 101 made of GaN, an n-type contact layer 102 made of n-type $Al_{0.015}Ga_{0.985}N$ which lattice-matches the substrate 101, a crack suppression layer 103 which has a thickness of about 0.1 μm and made of n-type $Ga_{0.95}In_{0.05}N$, an n-type superlattice cladding layer 104 made of n-type $Al_{0.15}Ga_{0.85}N/GaN$, an n-type optical guide layer 105 made of n-type GaN, a multi-quantum well (MQW) active layer 106 made of GaInN, a current blocking layer 107 made of p-type $Al_{0.2}Ga_{0.8}N$, a p-type optical guide layer 108 made of p-type GaN, a p-type superlattice cladding layer 109 made of p-type $Al_{0.15}Ga_{0.85}N/GaN$ and a p-type contact layer 110 made of p-type GaN are successively formed by growth.

The semiconductor laser device relating to a conventional example is characterized by having the crack suppression layer 103 made of GaInN between the n-type contact layer 102 and the n-type superlattice cladding layer 104.

Because of the crack suppression layer 103, lattice distortion that occurs between the n-type superlattice cladding layer 104 at which cracks easily occur because of its smallest lattice constant among a plurality of gallium nitride-based semiconductor layers including the active layer 106 for structuring a laser structure and its largest film thickness, and the n-type contact layer 102 which lattice-matches the substrate 101 is reduced, and generation of cracks caused by the lattice distortion occurred at a time of forming the laser structure is suppressed.

Although the aforementioned conventional gallium nitride-based semiconductor laser device is provided with the crack suppression layer 103 for alleviating the lattice distortion of the n-type contact layer 102 and the n-type cladding layer 104 between them, the close relationship between lattice constants of them is not considered. For this reason, adjusting a composition of In in the crack suppression layer 103 or its film thickness, or optimizing growth conditions is the only method for suppressing cracks generated at the n-type superlattice cladding layer 104.

For example, crystal defect or dislocation easily occurs at the crack suppression layer 103 because it generally grows at a temperature that is lower, by 150 to 300° C., than a growth temperature of semiconductor layer such as the n-type cladding layer 104 or the like and a temperature of the crack suppression layer 103 is increased when the n-type cladding layer 104 and the n-type optical guide layer 105 are grown on the crack suppression layer 103 and thus the thermally instable crack suppression layer 103 is exposed to a higher temperature than its growth temperature. Accordingly, crystallization property of the crack suppression layer 103 is inferior and its reproducibility at a time of its growth is poor. Consequently, it is difficult to produce the crack suppression layer 103 itself As a result, the n-type superlattice cladding layer 104 growing on the crack suppression layer 103 receives defectives generated at the crack suppression layer 103 and thus it is not easy to form a laser structure with high quality semiconductor crystalline layers.

When the crack suppression layer 103 is provided between the n-type contact layer 102 and the n-type superlattice cladding layer 104, the crack suppression layer 103 with inferior crystallization property serves as a current path. Thus, there arises a problem in that a reliability of element at a time of high output operation is decreased, for example, a reverse withstand voltage is reduced.

Further, an effect of suppressing cracks generated at the n-type contact layer 102 which lattice-matches the substrate 101 made of gallium nitride cannot be expected for the conventional crack suppression layer 103.

Moreover, when such device is applied to a semiconductor laser device, in particular, a laser device for optical disk that is capable of reading and writing, there arises a problem in that spontaneous emission light leaking from the active layer 106 during low output operation at a time of reading becomes a source of noise. The aforementioned conventional gallium nitride-based semiconductor laser device does not consider suppression of such spontaneous emission light.

SUMMARY OF THE INVENTION

The present invention was developed in light of the aforementioned conventional drawbacks, and an object of the present invention is to suppress cracks generated at a growing nitride semiconductor when a nitride semiconductor is formed on a substrate made of nitride semiconductor by crystal growth.

In order to accomplish the aforementioned object, a nitride semiconductor of the present invention comprises a first semiconductor layer made of first nitride semiconductor; and a second semiconductor layer that is made of second nitride semiconductor and is formed on a main surface of the first semiconductor layer by growth, wherein a lattice constant of the first semiconductor layer is different from that of the second semiconductor layer within their surfaces parallel to the main surface.

In accordance with the nitride semiconductor of the present invention, the second semiconductor layer is formed on the first semiconductor layer by growth, but the lattice constant of the first semiconductor layer within a surface parallel to its main surface is different from that of the second semiconductor layer within a surface parallel to its main surface. Here, as well known, for example, a semiconductor luminous element usually utilizes a double heterojunction structure formed by an active layer and cladding layers that are formed so as to sandwich the active layer and have the composition that their forbidden band widths are larger than that of the active layer and their refractive indexes are smaller than that of the active layer. Namely, in a case of nitride semiconductor luminous element, indium is usually added to the active layer and aluminum is added to the cladding layers. Because aluminum (Al) has smaller atomic radius than gallium (Ga), a lattice constant of aluminum gallium nitride (AlGaN) is smaller than that of gallium nitride (GaN). For example, assume that the first semiconductor layer is made of GaN and the second semiconductor layer is made of AlGaN epitaxially grown on the first semiconductor layer. Then, even if the lattice constant of the second semiconductor layer does not perfectly coincide with that of the first semiconductor layer serving as a base layer, lattice distortion occurs and the second semiconductor layer grows such that its lattice constant coincides with that of the first semiconductor layer. As a result, in the cladding layer that is required to have relatively large film thickness in the laser structure, if the lattice distortion exceeds the limit of film thickness, cracks are generated at the cladding layer.

Nevertheless, in accordance with the present invention, the lattice constant of the first semiconductor made of nitride semiconductor within a surface parallel to its main surface is different from that of the second semiconductor layer made of nitride semiconductor within a surface parallel to its main surface. Thus, when the second semiconductor layer serves as the cladding layer or its base layer, cracks are not generated at the second semiconductor layer even if the composition of the first semiconductor layer is made of nitride semiconductor different from that of the second semiconductor layer.

Preferably, the nitride semiconductor of the present invention further comprises a facet-forming layer that is formed between the first semiconductor layer and the second semiconductor layer, contains aluminum, has a plurality of different facet surfaces on its surface and made of third nitride semiconductor, wherein the second semiconductor layer is grown with the facet-forming layer being a base layer.

As described above, since the second semiconductor layer grows with the facet-forming layer with a plurality of different facet surfaces on its surface being a base layer, the second semiconductor layer grows from the facet surface whose surface orientation is different from that of the main surface of the first semiconductor layer. As a result, the second semiconductor layer grows so as to have a component directed in a direction of being parallel to the main surface of the first semiconductor layer, that is to say, performs lateral growth. For this reason, the lattice constant of the second semiconductor layer within a surface parallel to the main surface of the first semiconductor layer is compressed by a stress at a time of growth and thus becomes different from that of the first semiconductor layer.

In this case, one of the plurality of facet surfaces is preferably parallel to the main surface of the first semiconductor layer and the other is preferably inclined with respect to the main surface.

Further, in this case, surface orientation of the first facet surface is preferably (0001) surface, and surface orientation of the second facet surface is {1-101} surface or {1-102} surface. In this application of the description, a negative sign "–" attached to Mirror indices of surface orientation conveniently refers to as inversion of Mirror indices after the negative sign.

In accordance with the nitride semiconductor of the present invention, the first semiconductor layer is preferably formed by growth on a substrate made of aluminum gallium indium nitride ($Al_xGa_yIn_zN$ (wherein $0 \leq x, y, z \leq 1$, $x+y+z=1$)), compound crystal containing nitrogen, sapphire, silicon carbide or gallium arsenide.

A method for manufacturing nitride semiconductor of the present invention comprises a first step of growing a facet-forming layer made of the second nitride semiconductor containing aluminum on the first semiconductor layer made of the first nitride semiconductor at a first temperature; a second step of performing a thermal treatment for the facet-forming layer at a second temperature higher than the first temperature to form a plurality of facet surfaces with different surface orientations on the surface of the facet-forming layer; and a third step of growing the second semiconductor layer made of third nitride semiconductor on the facet-forming layer subjected to the thermal treatment at a third temperature higher than the first temperature, wherein a lattice constant of the first semiconductor layer is different from that of the second semiconductor within the respective surfaces parallel to the main surface of the first semiconductor layer.

In accordance with the method for manufacturing nitride semiconductor of the present invention, the second semiconductor grown on the facet-forming layer grows such that its lattice constant within a surface parallel to its substrate surface is different from that of the first semiconductor layer. In this way, the nitride semiconductor of the present invention can be obtained.

In accordance with the method for manufacturing nitride semiconductor of the present invention, the second step is preferably performed under atmosphere containing ammonia and hydrogen.

At this time, a partial pressure of hydrogen contained in the atmosphere is preferably set to be equal to or higher than a partial pressure of carrier gas made of inactive gas except the hydrogen.

In accordance with the method for manufacturing nitride semiconductor, surface orientation of one of the plurality of facet surfaces is preferably (0001) surface, and the surface orientation of the other surface is preferably {1-101} surface or {1-102} surface.

The method for manufacturing nitride semiconductor of the present invention preferably further comprises, prior to the first step, a fourth step of growing the first semiconductor layer on a substrate made of aluminum gallium indium nitride ($Al_xGa_yIn_zN$ (wherein $0 \leq x, y, z \leq 1$, $x+y+z=1$)), compound crystal containing nitrogen, sapphire, silicon carbide or gallium arsenide.

A nitride semiconductor device of the present invention comprises a first semiconductor layer made of first nitride semiconductor; a facet-forming layer that is formed on the main surface of the first semiconductor layer, contains aluminum, has a plurality of different facet surfaces on its upper surface, and made of second nitride semiconductor; a second semiconductor layer that is formed on the facet-forming layer by growth and made of third nitride semiconductor; and a third semiconductor layer that is formed on the second semiconductor layer by growth and made of fourth nitride semiconductor with its composition of aluminum being relatively large, wherein a lattice constant of the first semiconductor layer is different from that of the second semiconductor layer within the respective surfaces parallel to the main surface, and the lattice constant of the second semiconductor layer substantially coincides with the lattice constant of the third semiconductor layer in a bulk state.

In accordance with the nitride semiconductor device of the present invention, the lattice constant of the second semiconductor layer substantially coincides with that of the third semiconductor layer in a bulk state. Thus, even if a thickness of the third semiconductor layer is relatively large, cracks are not generated at the third semiconductor layer.

The nitride semiconductor device of the present invention further comprises an active layer made of fifth nitride semiconductor on the second semiconductor layer, wherein an energy gap of the facet-forming layer is preferably smaller than an energy corresponding to an emission wavelength oscillated from the active layer.

In accordance with the nitride semiconductor device, preferably, an operational current does not flow through the facet-forming layer.

In accordance with the nitride semiconductor device of the present invention, a surface orientation of one of the plurality of facet surfaces is preferably (0001) surface, and a surface orientation of the other surface is preferably {1-101} surface or {1-102} surface.

In accordance with the nitride semiconductor device of the present invention, the first semiconductor layer is preferably formed by growth on a substrate made of aluminum gallium indium nitride ($Al_xGa_yIn_zN$ (wherein $0 \leq x, y, z \leq 1$, x+y+z=1)), compound crystal containing nitrogen, sapphire, silicon carbide or gallium arsenide.

DETAILED DESCRIPTION OF THE INVENTION

First Embodiment

A first embodiment of the present invention will be described with reference to the drawings.

Figure 1A:
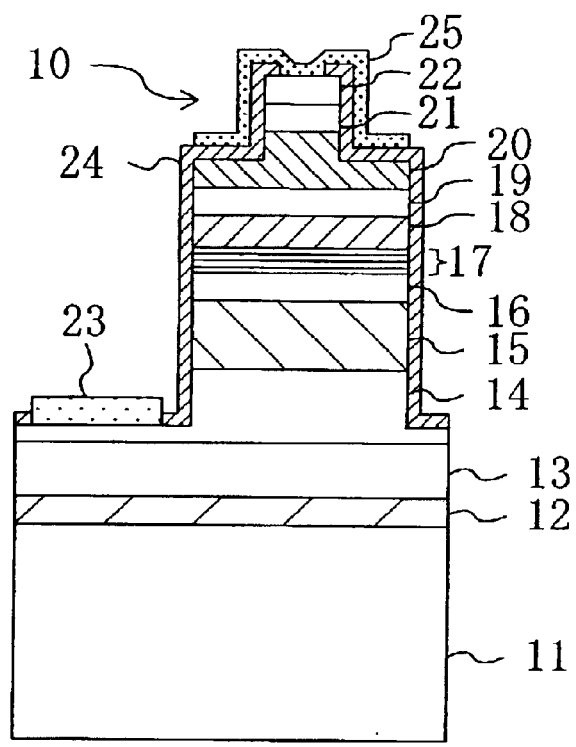
FIG. 1(a) is a cross-sectional structural view showing a nitride semiconductor laser device relating to a first embodiment of the present invention.

FIG. 1(a) shows a cross-sectional structure of nitride semiconductor laser device relating to the first embodiment of the present invention.

As shown in FIG. 1(a), on a substrate 11 made of, for example, gallium nitride (GaN), a facet-forming layer 12 made of aluminum gallium indium nitride ($Al_xGa_yIn_zN$ (wherein $0<x \leq 1$, $0 \leq y$, $z \leq 1$, x+y+z=1)) is formed. On the facet-forming layer 12, a selective growth layer 13 made of undoped GaN, an n-type contact layer 14 made of n-type GaN with silicon (Si), for example, being a dopant, an n-type cladding layer 15 made of n-type $Al_{0.07}Ga_{0.93}N$, an n-type optical guide layer 16 made of n-type GaN, a multi-quantum well (MQW) active layer 17, a current blocking layer 18 made of p-type $Al_{0.14}Ga_{0.86}N$ with magnesium (Mg), for example, being a p-type dopant, a p-type optical guide layer 19 made of p-type GaN, a p-type superlattice cladding layer 20, a p-type second contact layer 21 made of p-type GaN and a p-type first contact layer 22 made of densely doped p-type GaN than the p-type second contact layer 21 are successively formed by growth.

Figure 1B:
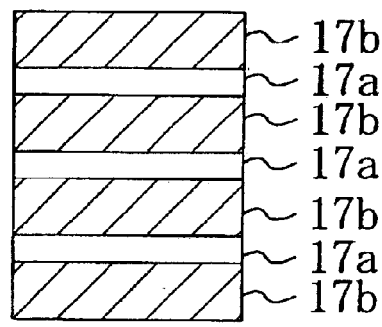
FIG. 1(b) is a partial cross-sectional structural view showing an active layer of the nitride semiconductor laser device relating to the first embodiment of the present invention.

The MQW active layer 17 is structured, as shown in FIG. 1(b), by three well layers 17a each of which has a thickness of about 3 nm and is made of gallium indium nitride ($Ga_{0.9}In_{0.1}N$) and four barrier layers 17b formed between the well layers 17a, each of which has a thickness of about 6 nm and is made of GaN.

Figure 1C:
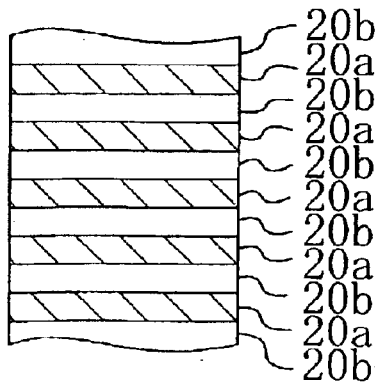
FIG. 1(c) is a partial cross-sectional structural view showing a p-type superlattice cladding layer of the nitride semiconductor laser device relating to the first embodiment of the present invention.

The p-type superlattice cladding layer 20 is formed, as shown in FIG. 1(c), by laminating 140 cycles of a first layer 20a which has a thickness of about 2.5 nm and made of p-type aluminum gallium nitride ($Al_{0.14}Ga_{0.86}N$) and a second layer 20b made of GaN. A total thickness of the p-type superlattice cladding layer 20 is about 700 nm. In the first layer 20a and the second layer 20b, the first layer 20a is a p-type semiconductor herein. Nevertheless, the present invention is not limited to this case, and either of them may be a p-type. Magnesium is used for p-type dopant.

A part of the n-type contact layer 14 is exposed because etching is performed from the p-type first contact layer 22 to an upper portion of the n-type contact layer 14. An n-side electrode 23 made of, for example, laminate of titanium (Ti) and aluminum (Al) is formed on an exposed surface of the n-type contact layer 14.

Etching is performed from the p-type first contact layer 22 through the p-type second contact layer 21 to an upper portion of the p-type superlattice cladding layer 20 so that a stripe cavity structure is formed in the MQW active layer 17. In this way, a ridge portion 10 is formed.

Side surfaces of the ridge portion 10 and mesa-shaped semiconductor layers to the n-type contact layer 14 are covered with protective insulating film 24 made of, for example, silicon oxide ($SiO_2$) so that an upper surface of the ridge portion 10 with a width of 3 $\mu$m to 5 $\mu$m is remained uncovered.

An upper surface of the p-type first contact layer 22 exposed from the protective insulating film 24 serves as a current injection area of a laser device. A p-side electrode 25 made of laminate of, for example, nickel (Ni) and gold (Au) is formed at the upper surface and the side surfaces of the ridge portion 10 so as to contact the current injection area.

A composition of Al in the current blocking layer 18 is 0.14 and larger than an average composition 0.07 of Al in the p-type superlattice cladding layer 20. Thus, a band gap of the current blocking layer 18 is larger than that of the cladding layer 20. For this reason, the current blocking layer 18 functions as a barrier layer which prevents electrons injected from the n-type contact layer 14 from leaking into the p-type optical guide layer 19, not injected into the active layer 17.

A method for manufacturing a nitride semiconductor laser device with the above-described structure will be described hereinafter by using FIGS. 1(a) and 2(a) through 2(d).

An MOVPE method is used herein as an example of crystal growth method. A growth pressure of nitride semiconductor may be any of reduced pressure state which is lower than atmosphere (1 atm), a normal pressure state which is equal to atmosphere and pressurized state which is higher than atmosphere. Further, the growth pressure may be changed to an appropriate pressure for each semiconductor layer. Inactive gas comprised of nitride ($N_2$) or hydrogen ($H_2$) is used for a carrier gas which introduces a source gas of the group III including gallium and the like on the substrate 11.

Figure 2A:
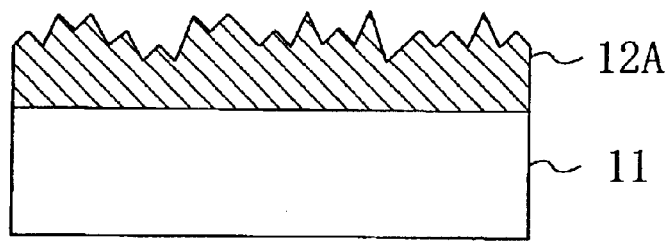
FIGS. 2(a) through 2(d) are cross-sectional structural views arranged in the order of step, showing a method for manufacturing a facet-forming layer of the nitride semiconductor laser device relating to the first embodiment of the present invention.

Firstly, as shown in FIG. 2(a), a substrate 11 that has a surface orientation of main surface of (0001) surface=(C surface) and made of gallium nitride (GaN) is charged into a reactive chamber of MOVPE device. Then, a growth temperature is set to about 550° C. Trimethylgallium (TMG) serving as a gallium source, trimethylaluminum (TMA) serving as an aluminum source, trimethylindium (TMI) serving as an indium source and ammonia ($NH_3$) serving as a nitrogen source are introduced onto the substrate 11. Consequently, a pre-facet-forming layer 12A made of AlGaInN grows on a main surface of the substrate 11. In this case, since the pre-facet-forming layer 12A grows at about 550° C. which is lower than about 1000° C. for growing a normal nitride semiconductor, the crystallization property of the pre-facet-forming layer 12A is insufficient and a surface morphology thereof is such that irregular configurations are provided. Nevertheless, because the pre-facet-forming layer 12A grows on the substrate 11 made of GaN, it is not polycrystalline.

Figure 2B:
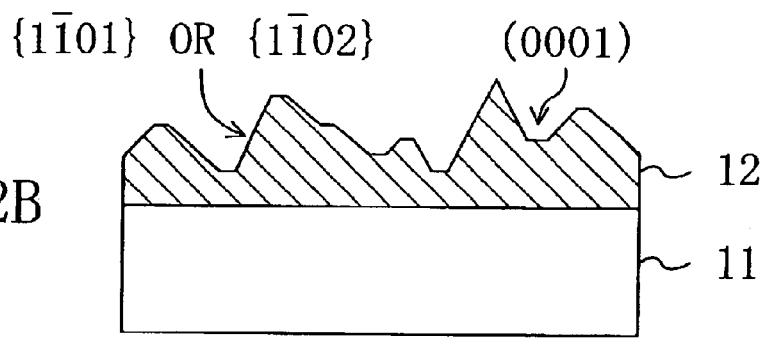

Next, as shown in FIG. 2(b), under conditions that the growth temperature is increased to about 1120° C. and a ratio of ammonia ($NH_3$) serving as the nitrogen source, hydrogen ($H_2$) and nitrogen ($N_2$) serving as carrier gas is 1:1:1 or 2:2:1, a thermal treatment is performed upon the pre-facet-forming layer 12A. As a result, realignment of crystal lattice occurs at the pre-facet-forming layer 12A. Because of this realignment, a surface of the pre-facet-forming layer 12A is changed into a facet-forming layer 12 including one facet surface ((0001) surface) parallel to a surface of substrate and the other facet surface ({1-101} surface or {1-102} surface) inclined with respect to the surface of substrate. Because of such surface orientations, the surface of the facet-forming layer 12 has irregular configuration with many hexagonal pyramids or hexagonal truncated pyramids. A thickness of the facet-forming layer 12 may be a thickness that hexagonal pyramids or hexagonal truncated pyramids can be formed and about 50 nm in the first embodiment. If $Al_{0.1}Ga_{0.9}N$ is used as an example of composition of the facet-forming layer 12, a heating treatment time in a case of such film thickness and composition is preferably a few minutes. A composition of Al in the facet-forming layer 12 is preferably in a range of 0<x<0.2. If x=0, the facet surfaces described above are hardly formed. If x≧0.2, conductivity of the facet-forming layer 12 is deteriorated.

Figure 2C:
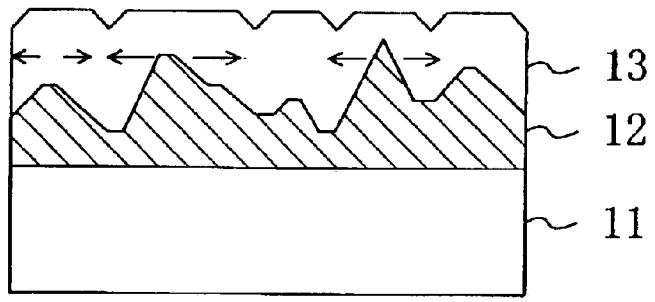
Figure 2D:
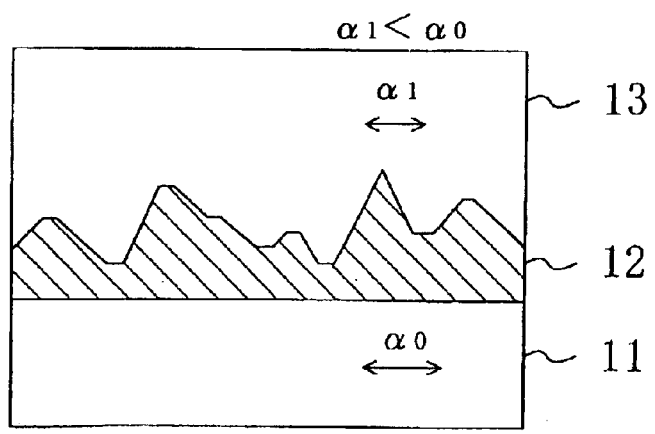

Next, as shown in FIG. 2(c), TMG serving as the gallium source and ammonia serving as the nitrogen source are introduced onto the substrate 11 with the growth temperature being about 1100° C., so that a selective growth layer 13 made of gallium nitride grows on the facet-forming layer 12. At this time, the selective growth layer 13 grows laterally from the {1-101} surface or the {1-102} surface that is formed on the surface of a facet-forming layer 12 so as to be inclined with respect to the surface of the substrate. Growth continues until a surface of the selective growth layer 13 is flat and thus a state shown in FIG. 2(d) is obtained. The growth temperature of the selective growth layer 13 is not limited to 1100° C. and may be 900° C. to 1300° C. depending on a pressure of growth atmosphere.

Thereafter, as shown in FIG. 1(a), on the selective growth layer 13, the n-type contact layer 14, the n-type cladding layer 15, the n-type optical guide layer 16, the MQW active layer 17, the p-type cap layer 18, the p-type optical guide layer 19, the p-type superlattice cladding layer 20, the p-type second contact layer 21 and the p-type first contact layer 22 are successively grown. At this time, the respective semiconductor layers from the selective growth layer 13 to the p-type first contact layer 22 crystal grow so that their a-axis lattice constants within their C surfaces lattice-match with each other.

A growth temperature of the MQW active layer 17 is about 780° C. so that indium atoms (In) are easily taken into crystals.

A lattice constant herein in a case of semiconductor layer utilizing a superlattice structure such as the p-type superlattice cladding layer 20 is an average of lattice constants of the respective layers constituting the superlattice structure. A substantial lattice match means herein a state that a difference of lattice constants newly defined because of lattice deformation caused by stress generated at a time when semiconductor layers with different bulk lattice constants are laminated together is within ±5%. The bulk lattice constant refers herein to as an original lattice constant of bulk not subjected to thermal distortion from substrate or the like.

Next, the ridge portion 10 is formed from the p-type first contact layer 22, the p-type second contact layer 21 to an upper portion of the p-type superlattice cladding layer 21 by dry etching using, e.g., chlorine ($Cl_2$) gas for etching gas. Subsequently, dry etching is performed from a lower portion of the p-type superlattice cladding layer 21 to an upper portion of the n-type contact layer 14 such that the ridge portion 10 is contained. As a result, the n-type contact layer 14 is exposed.

Then, a protective insulating film 24 is laminated at side surfaces of the ridge portion 10 and side surfaces of underlying laminate by a CVD method or the like so that a stripe opening portion with a width of 3 $\mu$m to 5 $\mu$m is formed at an upper surface of the p-type first contact layer 22 and an appropriate opening portion is formed on an exposed surface of the n-type contact layer 14.

Next, the p-side electrode 25 is formed by a deposition method or the like so as to include the opening portion of the ridge portion 10 in the protective insulating film 24. Further, the n-side electrode 23 is formed at the portion of the n-type contact layer 14 exposed from the protective insulating film 24. The order of forming the p-side electrode 25 and the n-side electrode 23 is arbitrary.

Thereafter, the substrate 11 is cleaved such that an end surface of resonator is exposed. As a result, a semiconductor laser device shown in FIG. 1(a) is obtained.

When a voltage is applied between the p-side electrode 25 and the n-side electrode 23 of resultant semiconductor laser device, a hole is injected from the p-side electrode 25 toward the MQW active layer 17 and an electron is injected from the n-side electrode 23 toward the MQW active layer 17. It is confirmed that the injected hole and electron generate a gain at the MQW active layer 17 and laser oscillation occurs at a wavelength of 405 nm.

A technical background of providing the facet-forming layer 12 and its function will be described hereinafter.
Technical Background of Facet-Forming Layer FIG. 3 shows the relationship between an a-axis lattice constant of gallium nitride which grows on a substrate made of gallium nitride (GaN) or sapphire and a composition of Al in a semiconductor layer made of aluminum gallium nitride (AlGaN) with its lattice constant lattice-matching the a-axis lattice constant.

Figure 3:
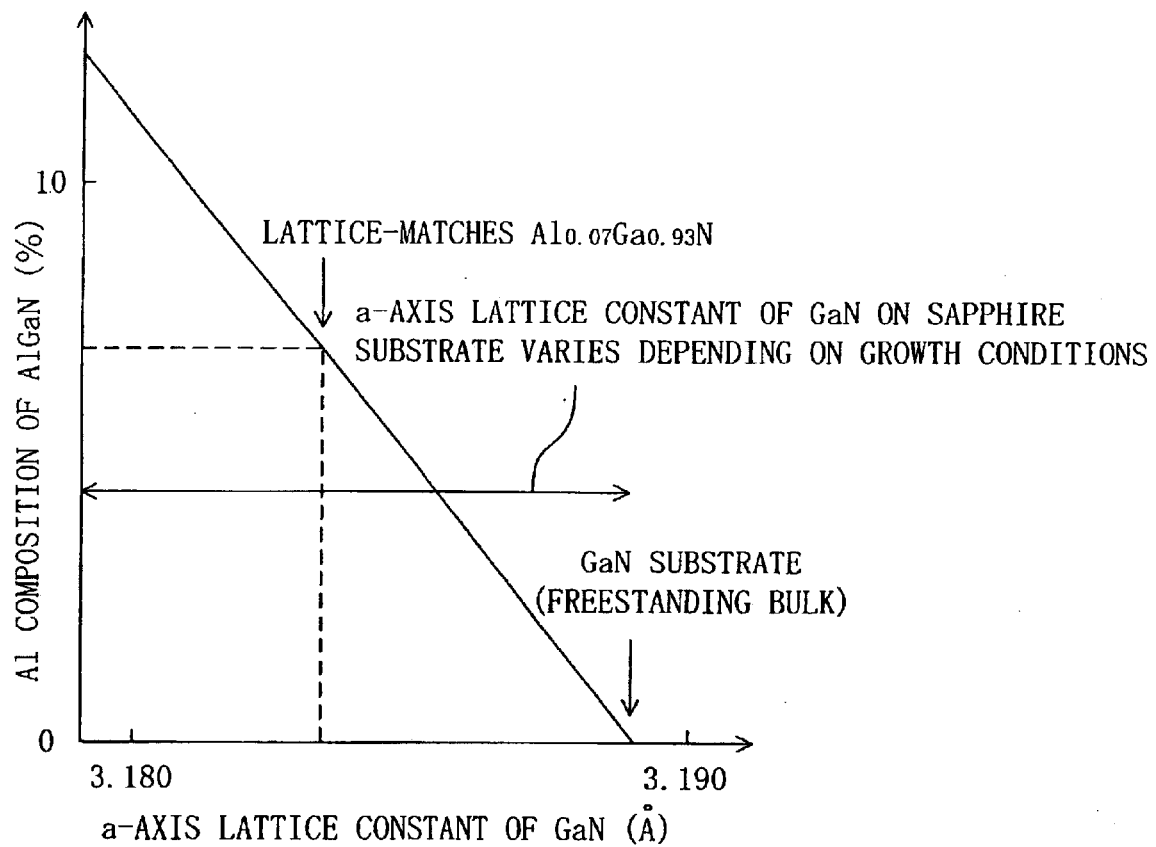
FIG. 3 is a graph showing the concept of the present invention, i.e., a graph showing the relationship between an a-axis lattice constant of gallium nitride grown on a substrate made of first gallium nitride or sapphire and a composition of Al of semiconductor layer made of aluminum gallium nitride whose lattice constant lattice-matches the a-axis lattice constant.

As shown in FIG. 3, a substrate made of GaN is a freestanding bulk crystal and has 3.189 Å of the a-axis lattice constant. Accordingly, an AlGaN layer which grows with the GaN substrate being a base layer cannot lattice-match without lattice distortion for the GaN substrate.

It is known that the a-axis lattice constant of GaN layer which grows with a sapphire substrate being a base layer is shrunk by being subjected to compression distortion within a C-surface because a thermal expansion coefficient of sapphire is larger than that of GaN. A thermal expansion coefficient of gallium nitride is $5.59 \times 10^{-6}$/K and a thermal expansion coefficient of sapphire is $7.5 \times 10^{-6}$/K.

As a result of study in cases of using, as a substrate for growing nitride semiconductor, a heterogeneous substrate (e.g., sapphire) made of material different from a semiconductor to be grown and using a cognate substrate (e.g., gallium nitride) made of the same material, present inventors have obtained the following views.

Firstly, the present inventors obtain a first view that a lattice constant of GaN which grows on a sapphire substrate serving as the heterogeneous substrate and is compressed sensitively depends on growth conditions in an MOVPE device for growing a gallium nitride-based semiconductor including, for example, a temperature of substrate, a gas type of carrier gas, a growth pressure, a flow rate of gas, a temperature of gas and a crystallization property of grown GaN.

For example, if a temperature of substrate is increased to about 1100° C., a temperature of source gas is set to 1020° C. and then a sapphire substrate is thoroughly thermally expanded, an a-axis of GaN layer is significantly compressed. The a-axis lattice constant of gallium nitride (GaN) is 3.189 Å and the a-axis lattice constant of aluminum nitride (AlN) is 3.112 Å. As well known, by adding aluminum into gallium nitride, the lattice constant is decreased in accordance with the composition of added Al.

The first view is that, by optimizing such growth conditions, the a-axis lattice constant of the GaN layer compressed by the sapphire substrate can be adjusted in a range corresponding to 0 to 10% of bulk lattice constant when converted into the Al composition of aluminum gallium nitride.

Accordingly, by adjusting the growth conditions of the GaN layer when a laser structure made of gallium nitride-based semiconductor is formed on a sapphire substrate, the a-axis lattice constant of the GaN layer is shrunk and can be substantially lattice-matched with an a-axis lattice constant of semiconductor layer made of AlGaN in a bulk state without substantial distortion.

When an AlGaInN layer is grown on a sapphire substrate instead of the GaN layer, as the GaN layer, the AlGaInN layer is naturally subjected to compression distortion by the sapphire substrate and its a-axis lattice constant is shrunk. As a result, as the GaN layer, by adjusting the growth conditions and compositions of Al and In, the AlGaInN layer can be substantially lattice-matched with an a-axis lattice constant of semiconductor layer made of AlGaN.

If a laser structure made of gallium nitride-based semiconductor is formed on a substrate made of not sapphire but silicon carbide (SiC) or silicon (Si), it is known that the semiconductor layer is subjected to stretch distortion within a C-surface and its a-axis lattice constant is stretched opposite to the case of sapphire because thermal expansion coefficient of silicon carbide or silicon is smaller than that of GaN. A thermal expansion coefficient of silicon carbide is $4.2 \times 10^{-6}$/K and a thermal expansion coefficient of silicon is $3.59 \times 10^{-6}$/K.

As described above, even if the GaN layer is subjected to stretch distortion, by adjusting the growth conditions for the GaN layer, a stretch of a-axis lattice constant of GaN layer can be made small and the GaN layer can be lattice-matched with an a-axis lattice constant of bulk semiconductor layer made of AlGaN without substantial distortion. The same effect can be obtained if the AlGaInN layer grows on a substrate made of silicon carbide or silicon.

It is needless to say that substantial lattice match with AlGaN layer is successful if lattice constants are close to each other. In accordance with a laser structure, for example, the AlGaN layer is a cladding layer that requires larger forbidden band width and smaller refractive index than the active layer and relatively larger film thickness.

On the other hand, when a semiconductor layer made of AlGaN with smaller bulk lattice coefficient than GaN is grown on a GaN layer grown on a substrate made of gallium nitride (GaN), i.e., on the cognate substrate, as well known, the larger an Al composition becomes, the larger a lattice distortion becomes and cracks and defects are increased.

Thus, it is difficult to obtain a laser structure without cracks being generated.

Function of Facet-Forming Layer

In accordance with the first embodiment, as described above, the pre-facet-forming layer 12A made of, e.g., $Al_{0.1}Ga_{0.9}N$ is grown on the substrate 11 made of GaN at a growth temperature of about 550° C. Then, a thermal treatment is performed for the pre-facet-forming layer 12A at about 1120° C. under an atmosphere containing ammonia and hydrogen. At this time, a partial pressure of hydrogen in the atmosphere is set to be equal to or higher than a partial pressure of carrier gas made of, e.g., nitrogen.

Realign of crystal lattice is occured at the pre-facet-forming layer 12A by the thermal treatment, and thus the facet-forming layer 12 having different surface orientations, e.g., (0001) surface and {1-101} surface or {1-102} surface at its surface is formed. The facet-forming layer 12 serves as a base layer with the same a-axis lattice constant as the n-type cladding layer 14 made of, e.g., AlGaN, for obtaining the selective growth layer 13 made of GaN.

The present inventors obtain a second view that since the selective growth layer 13 selectively starts to laterally grow from facet surfaces inclined with respect to a C-surface of the facet-forming layer 12, a lattice constant within a surface of the selective growth layer 13 parallel to the C-surface is compressed by a stress at a time of its growth and its a-axis lattice constant is shrunk. The a-axial lattice constant $\alpha_1$ of the selective growth layer 13 becomes smaller than the a-axis lattice constant $\alpha_0$ of the substrate 11. Specifically, the present inventors obtain the second view that a GaN layer (selective growth layer 13) having the same a-axis lattice constant as the GaN layer which is grown on the above-described sapphire substrate and then compressed, i.e., a-axis lattice constant corresponding to 0% to 10% of bulk lattice constant when converted into an Al composition of AlGaN layer can be grown.

In other words, by interposing the facet-forming layer 12, a lattice constant of the substrate 11 made of GaN is different from a lattice constant (a-axis lattice constant) within a surface parallel to a surface of substrate of GaN layer (selective growth layer 13) grown on the substrate 11.

Thus, the GaN layer (selective growth layer 13) can substantially lattice-match AlGaN layers (n-type cladding layer 14 and p-type superlattice cladding layer 20) growing thereon. Further, a laser structure without cracks being generated can be obtained by crystal growth.

Since a thermal treatment is performed for the pre-facet-forming layer 12A at a temperature which is higher than its growth temperature, crystal defects of the pre-facet-forming layer 12A itself can be reduced. As a result, the crystallization property of the facet-forming layer 12 is improved and crystallization properties of the selective growth layer 13 growing thereon and the respective semiconductor layers can be also improved.

In accordance with the first embodiment, by the second view, the facet-forming layer 12 which is made of AlGaInN and has a facet surface with its surface orientation being different from a surface of substrate is formed on the substrate 11 made of GaN. Then, the selective growth layer 13 made of GaN is grown on the formed facet-forming layer 12 serving as a base layer. In this way, an a-axis lattice constant of the selective growth layer 13 is substantially lattice-matched with a-axis lattice constants of the n-type cladding layer 14 and the p-type superlattice cladding layer 20.

Because of this structure, a semiconductor laser device relating to the first embodiment can obtain a flat growth surface without cracks being generated over an epitaxial growth layer on the substrate 11. As a result, a threshold current density of the semiconductor laser device at a time of laser oscillation is reduced as compared to a semiconductor laser device relating to a conventional example. Further, a manufacturing yield is significantly improved.

Different from a structure in which the crack suppression layer 103 relating to a conventional example is provided between the n-type contact layer 102 and the n-type superlattice cladding layer 104, the facet-forming layer 12 relating to the first embodiment is provided between the substrate 11 and the selective growth layer 13. For this reason, although the crack suppression layer 103 of the conventional example is placed in a current path, the facet-forming layer 12 of the first embodiment is provided outside the current path. Thus, even if defects occur at the facet-forming layer 12, such defects cannot be increased by current. Further, since the facet-forming layer 12 is provided far away from the MQW active layer 17, the n-type optical guide layer 16 and the p-type optical guide layer 19, the facet-forming layer 12 does not affect optical characteristics of the semiconductor layers 16, 17 and 19. As a result, an improvement in reversed withstand voltage characteristic, a long life at a time of high output operation and an improvement in yield can be realized.

Modified Example of First Embodiment

A modified example of the first embodiment of the present invention will be described hereinafter with reference to the drawings.

Figure 4:
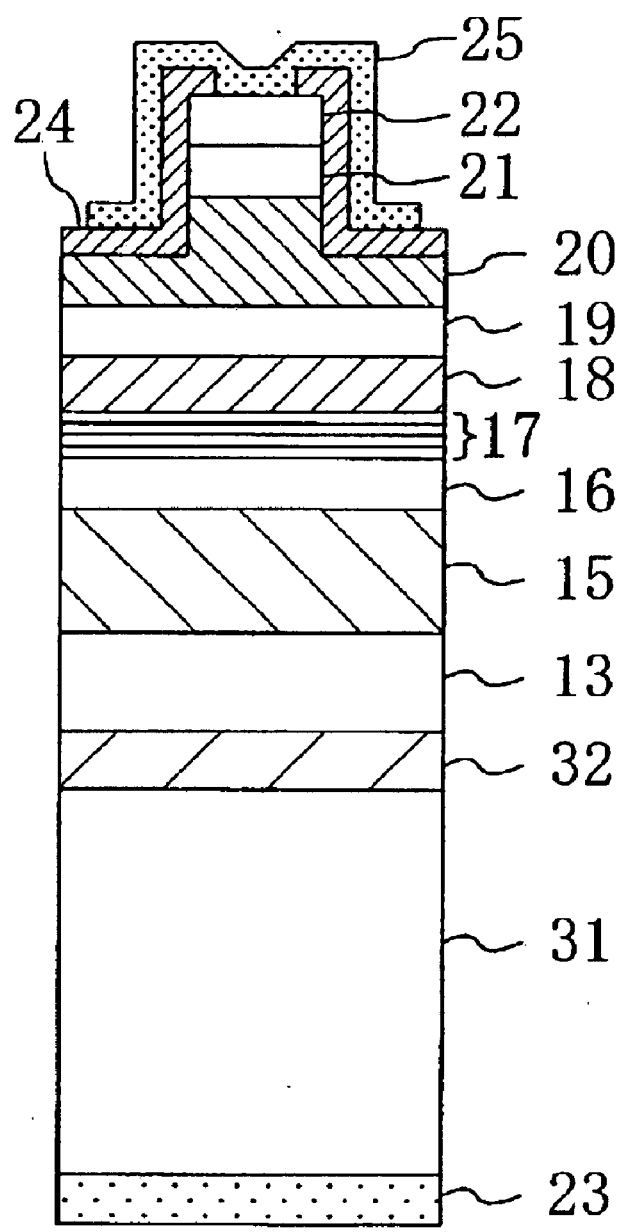
FIG. 4 is a cross-sectional structural view showing a nitride semiconductor laser device relating to a modified example of the first embodiment of the present invention.

FIG. 4 shows a cross-sectional structure of nitride semiconductor laser device relating to a modified example of the first embodiment of the present invention. Referring to FIG. 4, the same structural members as those of FIG. 1(a) are denoted by the same reference numerals and description thereof will be omitted.

As shown in FIG. 4, in accordance with this modified example, instead of the substrate 11 made of undoped gallium nitride (GaN), an n-type conductive substrate 31 made of n-type gallium nitride into which an n-type dopant such as silicon (Si), germanium (Ge) or oxygen (O) is added is used.

In accordance with a method for manufacturing the semiconductor laser device of this modified example, an n-type facet-forming layer 32 made of n-type AlGaInN with Si or the like being added thereto is formed on the n-type substrate 31. On the formed n-type facet-forming layer 32, the selective growth layer 13 made of n-type GaN is grown. Subsequently, on the selective growth layer 13, the respective semiconductor layers from the n-type cladding layer 15 to the p-type first contact layer 22 are successively grown.

Since the conductive n-type substrate 31 is used in this modified example, the n-type contact layer 14 does not need to be grown. Further, an etching step for exposing the n-type contact layer 14 is not required.

Instead the n-side electrode 23 is formed on a surface of the n-type substrate 31 opposite to the surface on which the facet-forming layer 32 is formed. Thus, the p-side electrode 25 opposes the n-side electrode 23. A current injected into a laser device substantially linearly flows through the laser device and thus laser oscillation occurs.

Since the crystallization property of the n-type facet-forming layer 32 is improved by thermal treatment performed at a temperature which is higher than its growth temperature at a time of forming the n-type facet-forming layer 32, a leak current caused by the n-type facet-forming layer 32 is sufficiently suppressed. Further, it is confirmed that a manufacturing yield is improved.

Further, a band gap of the facet-forming layer 12 relating to the first embodiment and the n-type facet-forming layer 32 relating to this modified example is made to be smaller than that of the MQW active layer 17 by adjusting compositions of Al, Ga and In. Thus, the facet-forming layer 12 and the n-type facet-forming layer 32 can absorb spontaneous emission light emitted from the MQW active layer 17. As a result, spontaneous emission light emitted from a rear surface of the substrate 11 or the n-type substrate 31 is suppressed, and thus a noise that is caused by the spontaneous emission light and generated at an electronic element or an electronic device disposed around the semiconductor laser device can be reduced.

Second Embodiment

A second embodiment of the present invention will be described hereinafter with reference to the drawings.

Figure 5:
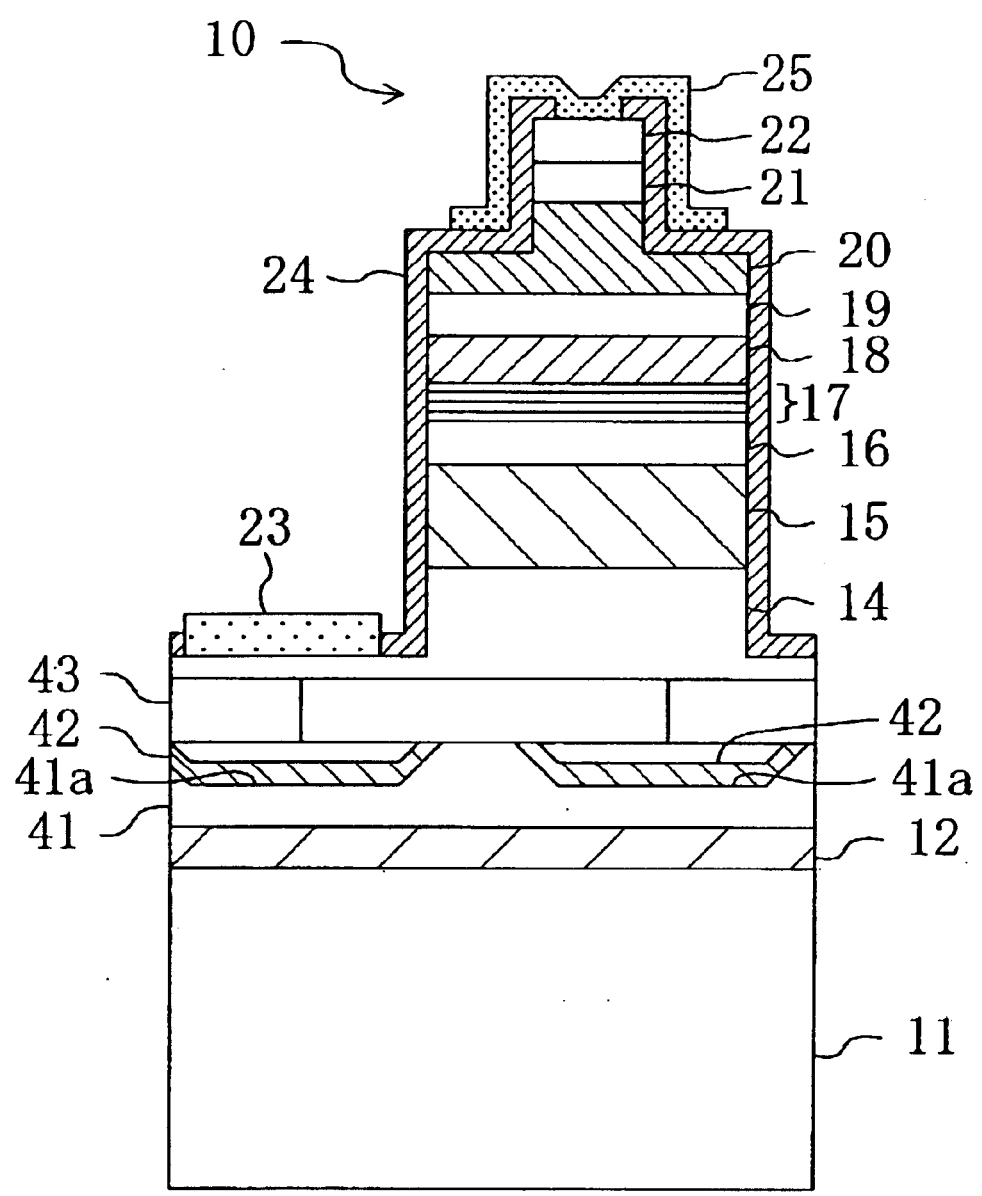
FIG. 5 is a cross-sectional structural view showing a nitride semiconductor laser device relating to a second embodiment of the present invention.

FIG. 5 shows a cross-sectional structure of nitride semiconductor laser device relating to a second embodiment of the present invention. Referring to FIG. 5, the same structural members as those of FIG. 1(a) are denoted by the same reference numerals and descriptions thereof will be omitted.

As shown in FIG. 5, in accordance with a semiconductor laser device relating to the second embodiment, a selective growth layer 41 that is made of AlGaInN and has a plurality of recessed portions 41a extending in a stripe manner is formed by growth on the facet-forming layer 12 made of AlGaInN. A mask film 42 made of, e.g., silicon nitride ($SiN_x$) is formed on a bottom surface and a wall surface of each recessed portion 41a of the selective growth layer 41.

A lateral growth layer 43 made of GaN is formed by growth on a surface of the selective growth layer 41 exposed from the mask film 42. On the lateral growth layer 43, as in the first embodiment, the respective layers from the n-type contact layer 14 to the p-type first contact layer 22 are successively formed by growth.

In accordance with the second embodiment, on the facet-forming layer 12, the selective growth layer 41 which enables known epitaxial lateral overgrowth (ELO) and has the recessed portions 41a is formed. Then, the lateral growth layer 43 is formed as the formed selective growth layer 41 being a base layer. Consequently, as compared to the semiconductor laser device relating to the first embodiment, the crystal defect of epitaxial semiconductor layer can be significantly reduced and thus high reliability of semiconductor laser device can be realized.

In a method for manufacturing the nitride semiconductor laser device with the aforementioned structure, steps until manufacturing of the selective growth layer will be described hereinafter with reference to FIGS. 6(a) through 6(c).

Figure 6A:
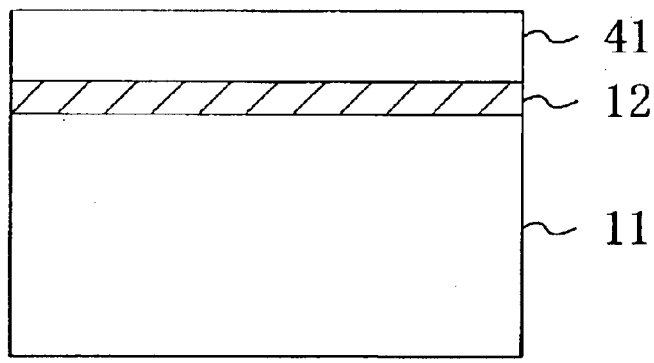
FIGS. 6(a) through 6(c) are cross-sectional structural views arranged in the order of step, showing a method for manufacturing a facet-forming layer, a selective growth layer and a lateral growth layer of the nitride semiconductor laser device relating to the second embodiment of the present invention.
Figure 6B:
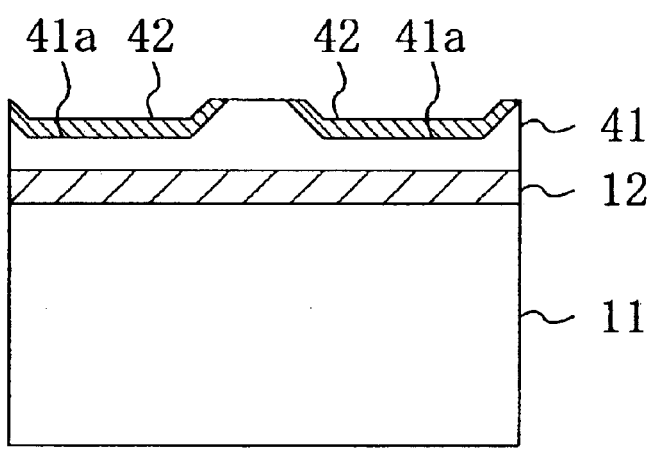

Firstly, as shown in FIG. 6(a), TMG, TMA and TMI serving as the source of the group III and $NH_3$ serving as a source of the group V are introduced, at a growth temperature of about 550° C., on the substrate 11 made of GaN by an MOVPE method so that a pre-facet-forming layer made of AlGaInN is grown on a main surface of the substrate 11. Subsequently, a thermal treatment is performed upon the pre-facet-forming layer for a few minutes under conditions that a temperature of substrate is increased to about 1120° C. and a ratio of ammonia serving as a nitrogen source, hydrogen and nitrogen serving as a carrier gas is 1:1:1 or 2:2:1. Thus, the facet-forming layer 12 which has, at its upper surface, a facet surface parallel to a surface of substrate and a facet surface inclined with respect to the surface of substrate is formed.

Next, the selective growth layer 41 made of AlGaInN is grown at a growth temperature of about 1100° C. with the facet-forming layer 12 being a base layer. At this time, since the selective growth layer 41 grows from a facet surface which is different from a substrate surface (C-surface) of the facet-forming layer 12, its a-axis lattice constant is smaller than that of the substrate 11.

Then, a resist pattern (not shown) including stripe patterns that extend parallel with each other at about 12 μm of intervals therebetween and each of which has a width of about 3 μm is formed on the selective growth layer 41 by lithography method. A direction that the stripes extend is, for example, a <1-100> direction of zone axis. Subsequently, dry etching is performed for the selective growth layer 41 as the formed resist pattern being a mask. Consequently, a plurality of stripe-shaped convex portions formed of a plurality of recessed portions 41a and areas sandwiched between the recessed portions 41a are formed on an upper portion of the selective growth layer 41. Then, the mask film 42 made of silicon nitride is laminated by an ECR sputtering method, for example, on the selective growth layer 41 with the recessed portions 41a being formed thereat over its entire surface including the resist pattern and the convex portions. Thereafter, the resist pattern is lifted off and the mask film 42 on the convex portions of the selective growth layer 41 is removed and thus upper surfaces of the convex portions are exposed. As a result, a state shown in FIG. 6(b) is obtained.

Figure 6C:
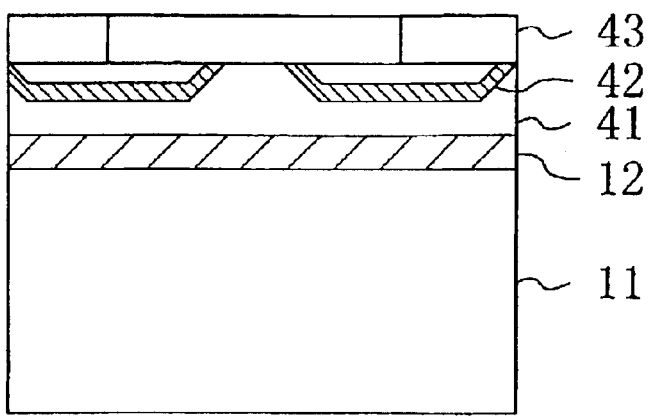

Then, as shown in FIG. 6(c), the lateral growth layer 43 that has a thickness of about 3 μm and is made of GaN is grown, at about 1000° C. of growth temperature, on the selective growth layer 41 by the MOVPE method again with an exposed surface of the convex portion of the selective growth layer 41 being a seed crystal by epitaxial lateral overgrowth that introduces TMG and $NH_3$ onto the selective growth layer 41.

Thereafter, as shown in FIG. 5, as in the first embodiment, the respective layers from the n-type contact layer 14 to the p-type first contact layer 22 are grown on the lateral growth layer 43. Then, dry etching for forming the ridge portion 10 is performed and dry etching for exposing the n-type contact layer 14 is performed. Subsequent to the protective insulating film 24 being formed, the p-side electrode 25 and the n-side electrode 23 are successively formed.

Although GaN is used for the lateral growth layer 43, AlGaInN may be used. If AlGaInN is used; compositions of Al and In must be adjusted such that an a-axis lattice constant of the lateral growth layer 43 substantially coincides with that of the n-type cladding layer 15.

First Modified Example of Second Embodiment

A first modified example of the second embodiment of the present invention will be described hereinafter with reference to the drawings.

Figure 7:
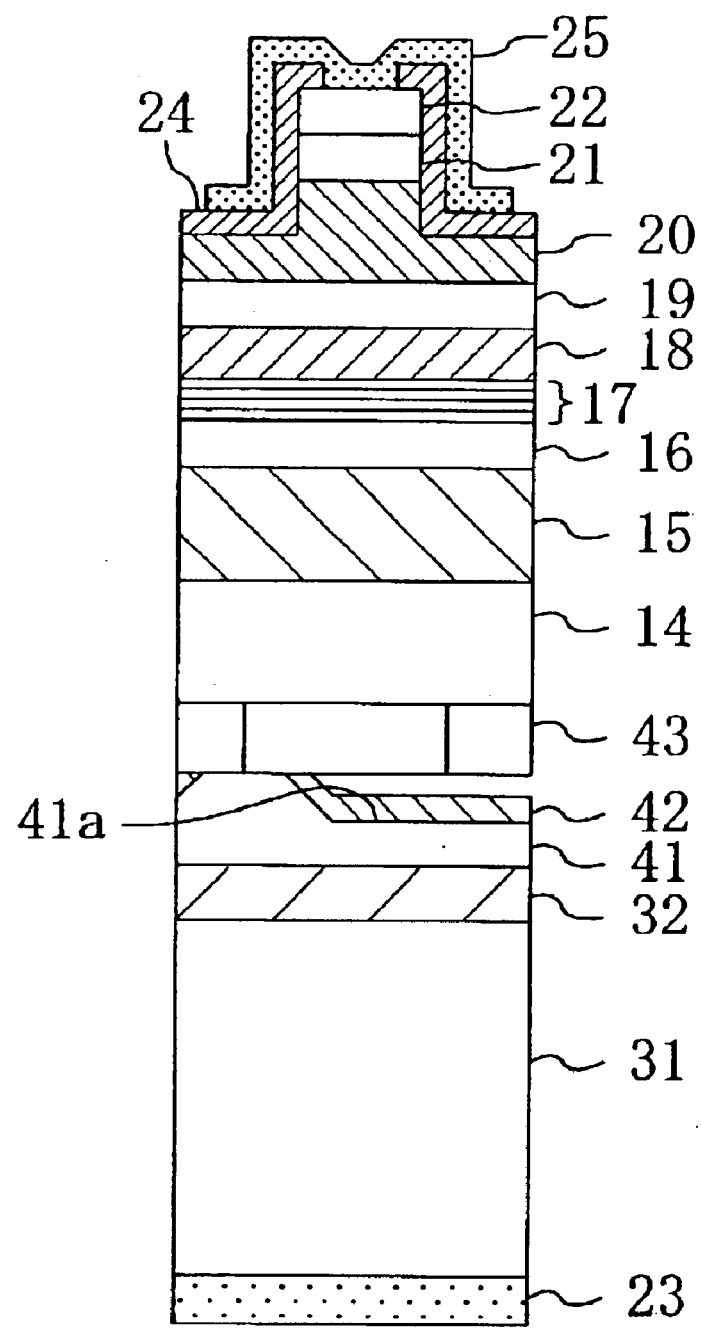
FIG. 7 is a cross-sectional structural view showing a nitride semiconductor laser device relating to a first modified example of the second embodiment of the present invention.

FIG. 7 shows a cross-sectional structure of nitride semiconductor laser device relating to the first modified example of the second embodiment of the present invention. Referring to FIG. 7, the same structural members as those of FIG. 5 are denoted by the same reference numerals and descriptions thereof will be omitted.

As shown in FIG. 7, in accordance with the first modified example, instead of the substrate 11 made of undoped GaN, a conductive n-type substrate 31 made of n-type gallium nitride into which an n-type dopant such as Si, Ge or O is added is used.

In accordance with a method for manufacturing the semiconductor laser device of the first modified example, on the n-type substrate 31, an n-type facet-forming layer 32 made of n-type AlGaInN with Si or the like being added thereto is formed. A selective growth layer 41 made of n-type AlGaInN is grown on the formed n-type facet-forming layer 32. Subsequently, a stripe recessed portion 41a is selectively formed on the selective growth layer 41. Further, a mask film 42 is formed on the recessed portion 41a. Then, a lateral growth layer 43 made of n-type GaN is selectively grown from the selective growth layer 41. Thereafter, the respective semiconductor layers from the n-type contact layer 14 to the p-type first contact layer 22 are successively grown.

In accordance with the first modified example, since the conductive n-type substrate 31 is used, an etching step for exposing the n-type contact layer 14 is not required.

The n-side electrode 23 is instead formed on a surface of the n-type substrate 31 opposite to the surface on which the facet-forming layer 32 is formed. Thus, the p-side electrode 25 is provided opposing the n-type electrode 23. A current injected into a laser device linearly flows through the laser device and thus laser oscillation occurs.

Since the crystallization property of the n-type facet-forming layer 32 is improved by thermal treatment performed at a temperature which is equal to or higher that its growth temperature at a time of forming the n-type facet-forming layer 32, a leak current from the n-type facet-forming layer 32 is sufficiently suppressed. Further, it is confirmed that a manufacturing yield is improved.

A band gap of the facet-forming layer 12 relating to the second embodiment or the n-type facet-forming layer 32 relating to the first modified example is made to be smaller than that of the MQW active layer 17 by adjusting compositions of Al, Ga and In. Consequently, the facet-forming layer 12 and the n-type facet-forming layer 32 can absorb spontaneous emission light emitted from the MQW active layer 17. As a result, spontaneous emission light emitted from a rear surface of the substrate 11 or the n-type substrate 31 is suppressed and thus a noise that is caused by the spontaneous emission light and generated at an electronic element or an electronic device disposed around the semiconductor laser device can be reduced.

Although silicon nitride is used for the mask film 42 provided on the selective growth layer 41, the present invention is not limited to silicon nitride. Any material may be used as long as a nitride semiconductor does not substantially crystal-grow thereon. For example, silicon oxide ($SiO_2$) or silicon (Si) may be used.

Second Modified Example of Second Embodiment

A description will be given hereinafter of second modified example of the second embodiment of the present invention with reference to the drawings.

In a method for manufacturing nitride semiconductor laser device relating to the second modified example of the second embodiment of the present invention, steps performed until a lateral growth layer is formed will be described with reference to FIGS. 8(a) through 8(c).

Figure 8A:
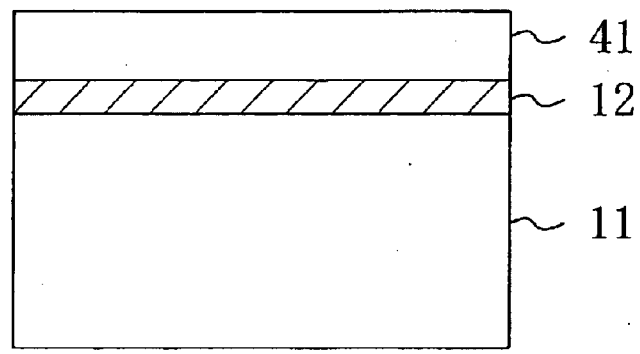
FIGS. 8(a) through 8(c) are cross-sectional structural views arranged in the order of steps, showing a method for manufacturing a facet-forming layer, a selective growth layer and a lateral growth layer of nitride semiconductor laser device relating to a second modified example of the second embodiment of the present invention.

Firstly, as shown in FIG. 8(a), the facet-forming layer 12 is formed on a main surface of the substrate 11. Then, the selective growth layer 41 is grown on the formed facet-forming layer 12.

Figure 8B:
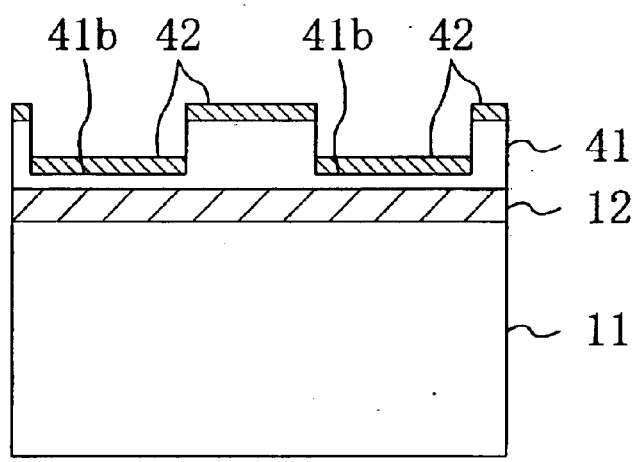

Next, as shown in FIG. 8(b), a stripe resist pattern (not shown) is formed by lithography method. Dry etching is performed for an upper portion of the selective growth layer 41 as the formed resist pattern being a mask. Thus, a plurality of recessed portions 41b with wall surfaces substantially perpendicular to the surface of substrate are formed on the upper portion of the selective growth layer 41. Then, the resist pattern is removed and a mask film 42 made of silicon nitride is laminated on the upper surface of the selective growth layer 41 and bottom surfaces of the recessed portions 41b. At this time, the wall surfaces of the recessed portions 41b are exposed.

Figure 8C:
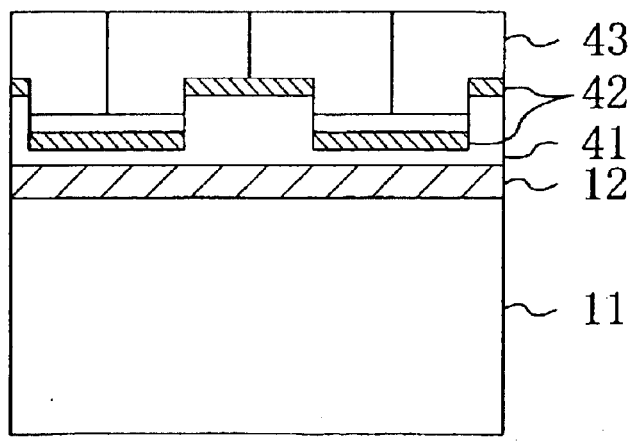

As shown in FIG. 8(c), the lateral growth layer 43 is selectively grown from the wall surfaces of the recessed portions 41b of the selective growth layer 41 and thus the crystal defect of the lateral growth layer 43 is reduced.

As a third modified example, a structure in which the film mask 42 is not applied to the recessed portions 41a and 41b in the second embodiment and the modified examples thereof may be provided.

Further, as a fourth modified example, the mask film 42 having stripe opening portions may be formed on the upper portion of the selective growth layer 41 without the recessed portions 41a and 41b being provided thereat. Then, the lateral growth layer 43 is selectively grown from surfaces of the selective growth layer 41 exposed from the mask film 42 and thus the crystal defect of the lateral growth layer 43 can be reduced.

Third Embodiment

A description will be given hereinafter of a third embodiment of the present invention with reference to the drawings.

Figure 9:
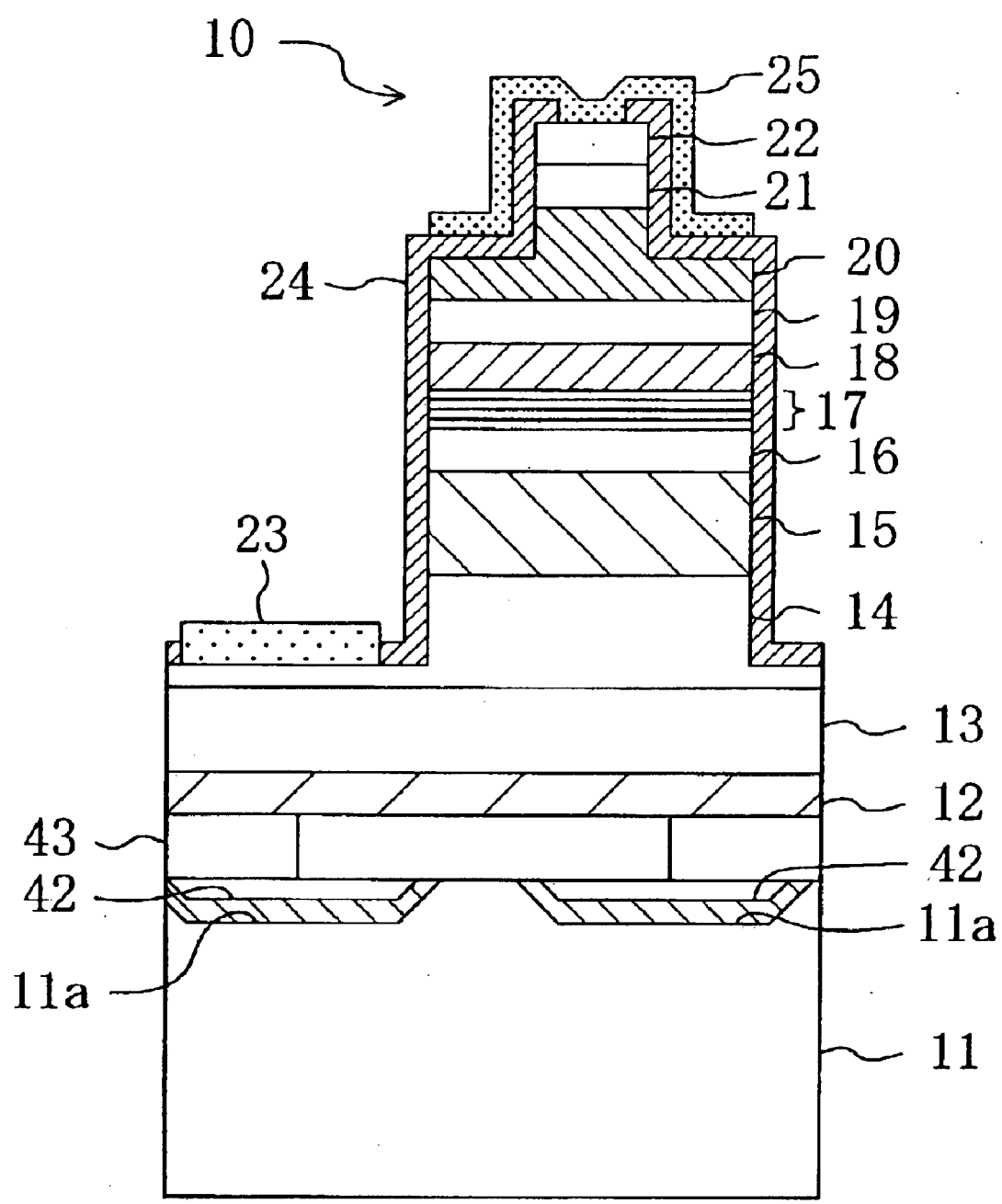
FIG. 9 is a cross-sectional structural view showing a nitride semiconductor laser device relating to a third embodiment of the present invention.

FIG. 9 shows a cross-sectional structure of nitride semiconductor laser device relating to a third embodiment of the present invention. Referring to FIG. 9, the same structural members as those of FIG. 5 are denoted by the same reference numerals and descriptions thereof will be omitted.

In accordance with the second embodiment, the facet-forming layer 12 is formed on the substrate 11 and then the lateral growth layer 43 is formed by the ELO method. On the other hand, in accordance with the third embodiment, the lateral growth layer 43 is formed by the ELO method on the substrate 11 made of GaN, and then the facet-forming layer 12 is formed on the lateral growth layer 43.

As shown in FIG. 9, stripe recessed portions 11a are formed on an upper portion of the substrate 11. The mask film 42 is formed on bottom surfaces and wall surfaces of the recessed portions 11a. A direction that stripes extend is a direction of <1-100 > of crystal axis.

The lateral growth layer 43 relating to the third embodiment selectively grows from a top surface of convex portion of the substrate 11 between the mask films 42. Accordingly, the crystal defect of the facet-forming layer 12 growing on the lateral growth layer 43 is further reduced.

In a method for manufacturing nitride semiconductor laser device with the above-described structure, steps until manufacturing of second selective growth layer will be described hereinafter with reference to FIGS. 10(a) through 10(c).

Figure 10A:
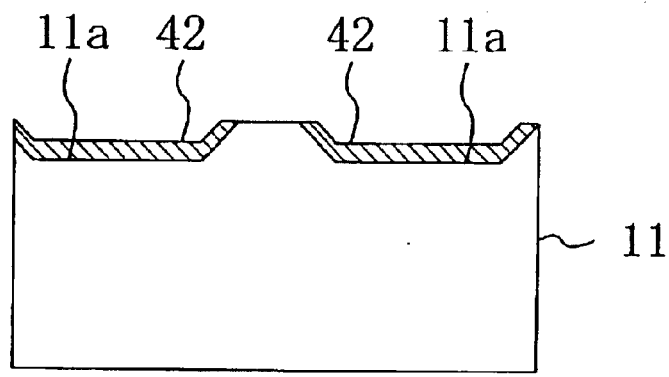
FIGS. 10(a) through 10(c) are cross-sectional structural views arranged in the order of steps, showing a method for manufacturing a lateral growth layer, a facet-forming layer and a selective growth layer of nitride semiconductor laser device relating to the third embodiment of the present invention.

Firstly, as shown in FIG. 10(a), resist patterns (not shown) extending parallel with each other at about 12 μm of intervals therebetween, each of which has a width of about 3 μm are formed by lithography method on the substrate 11 made of gallium nitride (GaN). Then, dry etching is performed upon the substrate 11 as the formed resist patterns being a mask. Thus, a plurality of stripe convex portions formed by a plurality of recessed portions 11a and areas sandwiched by the recessed portions 11a are formed on the upper portion of the substrate 11. Subsequently, the mask film 42 made of silicon nitride is laminated, by an ECR sputtering method, for example, on the substrate 11 with the recessed portions 11a being formed thereat over its entire surface including the resist patterns and the convex portions. Thereafter, the resist patterns are lifted off and the mask film 42 laminated on the convex portions of the substrate 11 is removed and thus upper surfaces of the convex portions are exposed.

Figure 10B:
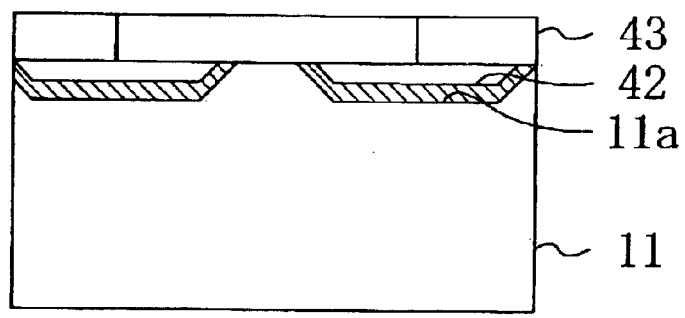

Next, as shown in FIG. 10(b), because of epitaxial lateral overgrowth that TMG serving as a source of the group III and $NH_3$ serving as a source of the group V are introduced onto the substrate 11, the lateral growth layer 43 which has a thickness of about 3 μm and made of GaN is grown on the substrate 11 at a growth temperature of about 1000° C. by the MOVPE method with exposed surfaces of the convex portions of the substrate 11 serving as a seed crystal.

Figure 10C:
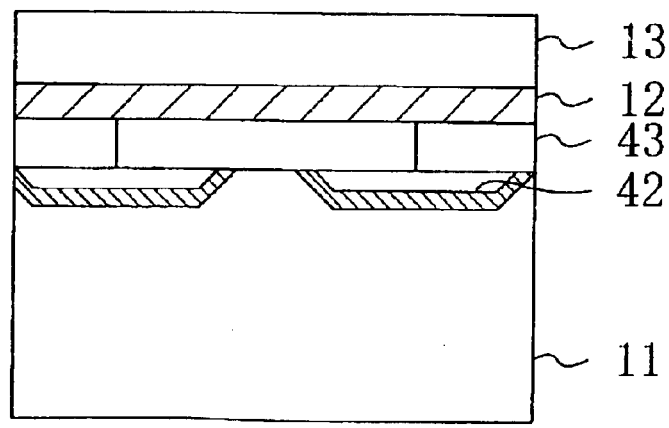

Then, as shown in FIG. 10(c), a pre-facet-forming layer made of AlGaInN is grown on the lateral growth layer 43 at about 550° C. of growth temperature by introducing TMG, TMA and TMI serving as the source of the group III and $NH_3$ serving as a source of the group V. Then, a thermal treatment is performed upon the pre-facet-forming layer for a few minutes under conditions that a temperature of substrate is increased to about 1120° C. and a ratio of ammonia serving as a nitrogen source, hydrogen and nitrogen serving as carrier gas is 1:1:1 or 2:2:1. As a result, the facet-forming layer 12 having, on its upper surface, a facet surface parallel to the surface of substrate and a facet surface inclined with respect to the surface of substrate is formed.

Next, the selective growth layer 13 made of AlGaInN is grown at about 1100° C. of growth temperature with the facet-forming layer 12 being a base layer. At this time, since the selective growth layer 13 grows from a facet surface which is different from a substrate surface (C-surface) of the facet-forming layer 12, its a-axis lattice constant is smaller than that of the lateral growth layer 43.

Subsequently, as shown in FIG. 9, similar to the first embodiment, the respective layers from the n-type contact layer 14 to the p-type first contact layer 22 are grown on the selective growth layer 13. Dry etching for forming the ridge portion 10 and dry etching for exposing the n-type contact layer 14 are performed, and the protective insulating film 24 is formed. Then, the p-side electrode 25 and the n-side electrode 23 are successively formed.

Although GaN is used for the selective growth layer 13, AlGaInN may be used. If AlGaInN is used, compositions of Al and In must be adjusted such that the a-axis lattice constant of the selective growth layer 13 substantially coincides with that of the n-type cladding layer 15.

The lateral growth layer 43 may be grown by the same method as that of the second, third or fourth modified example of the second embodiment.

Modified Example of Third Embodiment

A modified example of the third embodiment will be described hereinafter with reference to the drawings.

Figure 11:
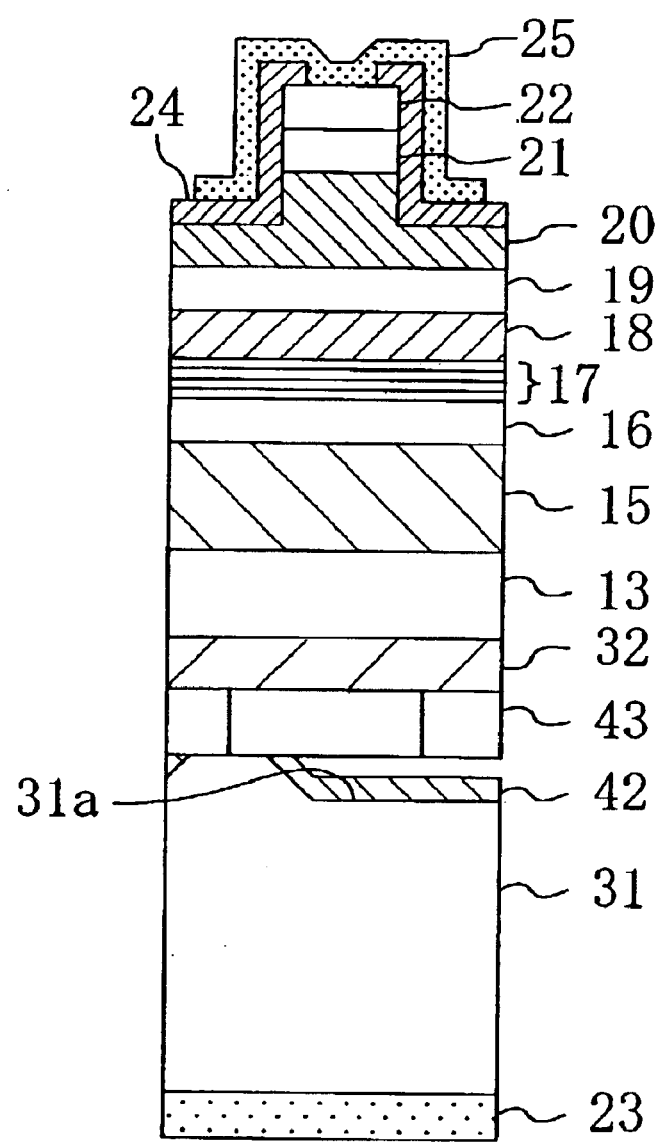
FIG. 11 is a cross-sectional structural view showing a nitride semiconductor laser device relating to a modified example of the third embodiment of the present invention.
Figure 12:
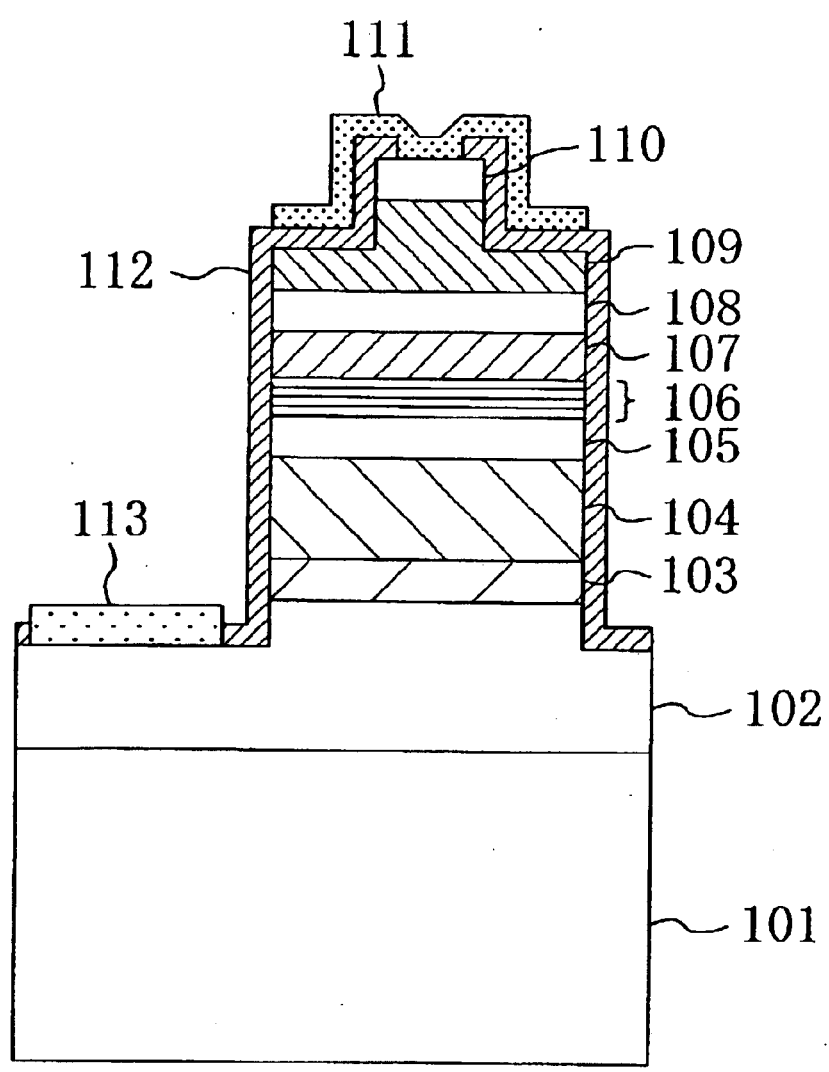
FIG. 12 is a cross-sectional structural view showing a conventional nitride semiconductor laser device.

FIG. 11 shows a cross-sectional structure of nitride semiconductor laser device relating to a modified example of the third embodiment of the present invention. Referring to FIG. 11, the same structural members as those of FIG. 9 are denoted by the same reference numerals and descriptions thereof will be omitted.

As shown in FIG. 11, in accordance with this modified example, instead of the substrate 11 made of undoped GaN, a conductive n-type substrate 31 made of n-type gallium nitride into which an n-type dopant such as Si, Ge or O is added is used.

In accordance with a method for manufacturing semiconductor laser device relating to this modified example, a recessed portion 31a is selectively formed on the upper portion of the n-type substrate 31, and the lateral growth layer 43 is formed by selective growth on the n-type substrate 31 with the recessed portion 31a being formed thereon. Then, the n-type facet-forming layer 32 made of n-type AlGaInN with Si or the like being added thereto is formed on the lateral growth layer 43. Further, the selective growth layer 13 made of n-type GaN is grown on the formed n-type facet-forming layer 32. Then, the respective semiconductor layers from the n-type cladding layer 15 to the p-type first contact layer 22 are formed respectively on the selective growth layer 13.

In accordance with this modified example, since the conductive n-type substrate 31 is used, the n-type contact layer 14 does not need to be grown. Further, a step of etching the n-type contact layer 14 to expose the same is not required.

Instead, the n-side electrode 23 is formed on the side of the n-type substrate 31 opposite to the side at which the lateral growth layer 43 is formed. As a result, the p-side electrode 25 opposes the n-side electrode 23 and thus a current injected into the laser device linearly flows through the laser device and thus laser oscillation occurs.

Since the crystallization property of the n-type facet-forming layer 32 is improved by the thermal treatment performed at a temperature which is equal to or higher than the growth temperature at a time of forming the n-type facet-forming layer 32, the current leaked from the n-type facet-forming layer 32 is sufficiently suppressed. Further, it is confirmed that a manufacturing yield is improved.

A band gap of the facet-forming layer 12 relating to the third embodiment or the n-type facet-forming layer 32 relating to this modified example is made to be smaller than that of the MQW active layer 17 by adjusting the compositions of Al, Ga and In. As a result, the facet-forming layer 12 and the n-type facet-forming layer 32 can absorb spontaneous emission light emitted from the MQW active layer 17. As a result, spontaneous emission light emitted from the rear surface of the substrate 11 or the n-type substrate 31 is suppressed and thus a noise which is caused by the spontaneous emission light and generated at an electronic element or an electronic device disposed around the semiconductor laser device can be reduced.

Although silicon nitride is used for the mask film 42 provided on the selective growth layer 41, the present invention is not limited to the silicon nitride and for example, silicon oxide or silicon may be used.

Although the MOVPE method is used as a growth method for nitride semiconductor in the first to third embodiments and modified examples thereof, the present invention is not limited to the MOVPE method. The present invention can apply a crystal growth method which can grow a nitride semiconductor layer, such as a hydride vapor phase epitaxy (HVPE) method or a molecular beam epitaxy (MBE) method and the like.

Although a laser structure made of nitride semiconductor is formed on the substrate 11 made of gallium nitride (GaN), the substrate 11 is not limited to the gallium nitride. For example, a bulk substrate made of nitride semiconductor such as aluminum gallium nitride (AlGaN), indium gallium nitride (InGaN) or aluminum gallium indium nitride (AlGaInN) may be used. Further, a nitride semiconductor which is grown on a substrate made of sapphire (single crystal $Al_2O_3$), silicon carbide (SiC), silicon (Si) or gallium arsenide (GaAs) may be used as new substrate. Namely, by providing a facet-forming layer between a substrate and an active layer (laser structure), a first nitride semiconductor crystal layer with different lattice constant within a surface parallel to a surface of substrate can be formed. Further, it is desirable that the first nitride semiconductor crystal layer substantially lattice-matches a cladding layer formed of second nitride semiconductor crystal layer formed by growth on the first nitride semiconductor crystal layer.

In the respective embodiments and modified examples thereof, (0001) surface (C-surface) is used for a main surface of the substrate 11. Nevertheless, the present invention is not limited to the C-surface as long as lattice match conditions of the present invention are satisfied. A substrate with a main surface inclined a little with respect to the C-surface in a direction of A-surface or M-surface may be used.

The structure that a lattice constant of the first semiconductor layer placed under the facet-forming layer of the present invention is different from that of the second semiconductor layer grown on the facet-forming layer within surfaces parallel to the respective growth surfaces is not limited to the case of gallium nitride-based semiconductor. Such structure is effective for any nitride compound semiconductors including boron nitride (BN) or compound crystal of BN and AlGaInN.

Although a structure of semiconductor laser device serving as a semiconductor device and its manufacturing method are described in the respective embodiments and their modified example, the present invention is not limited to luminous element. The present invention can be widely applied to semiconductor devices using nitride semiconductor.

What is claimed is:

1. A nitride semiconductor comprising:
   a first semiconductor layer made of first nitride semiconductor;
   a second semiconductor layer that is made of second nitride semiconductor and is formed on a main surface of said first semiconductor layer by growth; and
   a facet-forming layer that is formed between said first semiconductor layer and said second semiconductor layer, contains aluminum, has a plurality of different facet surfaces on its surface and made of third nitride semiconductor,
   wherein a lattice constant of said first semiconductor layer is different from that of said second semiconductor layer within their surfaces parallel to said main surface.

2. The nitride semiconductor according to claim 1, wherein one of said plurality of facet surfaces is parallel to the main surface of said first semiconductor layer and the other is inclined with respect to said main surface.

3. The nitride semiconductor according to claim 2, wherein surface orientation of said one surface is (0001) surface, and surface orientation of said the other surface is {1-101} surface or {1-102} surface.

4. The nitride semiconductor according to claim 1, wherein said first semiconductor layer is formed by growth on a substrate made of aluminum gallium indium nitride ($Al_xGa_yIn_zN$ (wherein $0 \leq x, y, z \leq 1$, $x+y+z=1$)), compound crystal containing nitrogen, sapphire, silicon carbide or gallium arsenide.

5. The nitride semiconductor according to claim 1, wherein said facet-forming layer is made of aluminum gallium indium nitride ($Al_xGa_yIn_zN$ (wherein $0 \leq x, y, z \leq 1$, $x+y+z=1$)), and the aluminum composition x of said facet-forming layer is $0<x<0.2$.

6. The nitride semiconductor according to claim 1, wherein said second semiconductor layer is grown with said facet-forming layer being a base layer, and a surface of said facet-forming layer has an irregular configuration with many hexagonal pyramids or hexagonal truncated pyramids.

7. A nitride semiconductor device comprising:
   a first semiconductor layer made of first nitride semiconductor;
   a facet-forming layer that is formed on the main surface of said first semiconductor layer, contains aluminum, has a plurality of different facet surfaces on its upper surface, and made of second nitride semiconductor;
   a second semiconductor layer that is formed on said facet-forming layer by growth and made of third nitride semiconductor; and
   a third semiconductor layer that is formed on said second semiconductor layer by growth and made of fourth nitride semiconductor with its composition of aluminum being relatively large,
   wherein a lattice constant of said first semiconductor layer is different from that of said second semiconductor layer within the respective surfaces parallel to said main surface, and the lattice constant of said second semiconductor layer substantially coincides the lattice constant of said third semiconductor layer in a bulk state.

8. The nitride semiconductor device according to claim 7 further comprising an active layer made of fifth nitride semiconductor on said second semiconductor layer,
   wherein an energy gap of said facet-forming layer is smaller than an energy corresponding to emission wavelength oscillated horn said active layer.

9. The nitride semiconductor device according to claim 7, wherein an operational current does not flow through said facet-forming layer.

10. The nitride semiconductor device according to claim 7, wherein surface orientation of one of said plurality of facet surfaces is (0001) surface, and surface orientation of the other surface is {1-101} surface or {1-102} surface.

11. The nitride semiconductor device according to claim 7, wherein said first semiconductor layer is formed by growth on a substrate made of aluminum gallium indium nitride ($Al_xGa_yIn_zN$ (wherein $0 \leq x, y, z \leq 1$, $x+y+z=1$)), compound crystal containing nitrogen, sapphire, silicon carbide or gallium arsenide.

12. The nitride semiconductor device according to claim 7, wherein said facet-forming layer is made of aluminum gallium indium nitride ($Al_xGa_yIn_zN$ (wherein $0 \leq x, y, z \leq 1$, $x+y+z=1$)), and the and the aluminum composition x of said facet-fanning layer is $0<x<0.2$.

13. The nitride semiconductor device according to claim 7, wherein a surface of said facet-forming layer has an irregular configuration with many hexagonal pyramids or hexagonal truncated pyramids.

* * * * *